United States Patent [19]

Aitken

[11] Patent Number: 5,194,748
[45] Date of Patent: Mar. 16, 1993

[54] METHOD AND APPARATUS RELATING TO ION IMPLANTATION

[75] Inventor: Derek Aitken, Surbiton, England

[73] Assignee: Superion Limited, Surbiton, England

[21] Appl. No.: 720,522

[22] PCT Filed: Oct. 26, 1990

[86] PCT No.: PCT/GB90/01653
§ 371 Date: Jun. 21, 1991
§ 102(e) Date: Jun. 21, 1991

[87] PCT Pub. No.: WO91/06972
PCT Pub. Date: May 16, 1991

[30] Foreign Application Priority Data

Oct. 27, 1989 [GB] United Kingdom ............... 8924223

[51] Int. Cl.[5] ...................... H01J 37/317; G21K 5/10
[52] U.S. Cl. .............................. 250/442.11; 250/358; 250/492.2
[58] Field of Search ............... 250/442.11, 358, 492.21, 250/492.2

[56] References Cited

U.S. PATENT DOCUMENTS

| | | | |
|---|---|---|---|
| 4,383,178 | 5/1983 | Shibata et al. | 250/442.1 |
| 4,508,056 | 4/1985 | Bruel et al. | 250/442.1 |
| 4,578,859 | 4/1986 | Hause et al. | |
| 4,733,087 | 3/1988 | Narita et al. | 250/442.1 |
| 4,794,305 | 12/1988 | Matsukawa | 250/442.1 |

FOREIGN PATENT DOCUMENTS 99778 2/1984 European Pat. Off. .

OTHER PUBLICATIONS

Nuclear Instruments and Methods, vol. 113, 1973, Amsterdam Nl. pp. 303-304, S. Lazarski et al., "A mechanical sample sweeping system for large surface irradiation".
Patent Abstract of Japan, vol. 11, No. 119, (E-499)(2566) 14 Apr. 1989, & JP-A-61 267248 (Fuji Electric Co. Ltd.) 26 Nov. 1987.
IBM Technical Disclosure Bulletin, vol. 10, No. 12, May 1968, New York US, p. 1962 F. R. Freeman; "Reciprocating carriage".

Primary Examiner—Bruce C. Anderson
Attorney, Agent, or Firm—Cushman, Darby & Cushman

[57] ABSTRACT

In ion implantation apparatus, a plurality of targets on supports are presented to an ion beam. The targets are moved back and forth in reciprocatory motion through the ion beam. Each target is reversed whilst outside the ion beam, and the reversals of the targets are effected while another target or targets is or are moving through the beam. Where two targets are presented, the sequence is that the two target supports follow each other through the ion beam in one direction, and then follow each other through the beam in the opposite direction, each target being reversed in direction while the other is passing through the beam.

18 Claims, 5 Drawing Sheets

METHOD AND APPARATUS RELATING TO ION IMPLANTATION

The present invention is concerned with a method and apparatus relating to ion implantation. In particular the invention relates to a method of an apparatus for presenting targets to an ion beam for ion implantation, and also relates to an overall method of and apparatus for implanting ions in a target element.

The invention relates in particular but not exclusively, to implanting ions of a preselected species, into a target element, for example the controlled introduction of a species into the surface layer of another material. The technique is important in semi-conductor technology where it is used in the manufacture of integrated circuits and other devices, particularly by modifying the conductivity of semi-conductor material by introducing chemical impurities into the material. The general background to the use of ion implantation in the manufacture of large scale integrated circuit chips is set out in published U.S. Pat. No. 4,578,589, having the same inventor as the present application.

An ion implantation apparatus normally consists of an ion source, an extraction system having an extraction electrode which accelerates the ions from the extraction slot in the ion source, an analysing magnet for the selection of the required ion species, acceleration stages before or after the analysing magnet, and a target region with means for producing relative scanning movement between the beam and the target, either by scanning the beam, or by moving the target.

There are a number of requirements for high dose implantation into semiconductors. The need for high current makes electrostatic beam scanning difficult because of space charge problems. Magnetic scanning of high energy, high mass beams requires large magnets, and scan frequencies tend to be limited by hysteresis and eddy current problems. The need to spread the large heat load, which is a direct consequence of the high dose, over a large number of wafers (in order to increase the implant time but still have high throughput) rules out single wafer implant. Hybrid scanning (beam scanning in one direction, mechanical scanning of the target in the other) is a partial solution to this problem, but the beam scan problems remain, although reduced in magnitude. Also, as the mechanical scan would logically be the slower of the two scan frequencies, the heat load spreading requirement is only partially addressed. Ideally the beam should pass in the fast scan direction over all the wafers in the batch before starting the next scan. Hybrid scanning does not in general achieve this.

As a consequence, mechanical scanning is generally considered to be the best solution to the problem, particularly when parallel scanning is required since parallel beam scanning is not easily achieved.

A number of different types of mechanical scanning are used, for example techniques which are known as linear mechanical scan, cylindrical carousel, Ferris wheel, racetrack carousel, and spinning disc. All these techniques have various drawbacks.

Linear mechanical scanning is a compact technique for large substrates. The problem is that it is inherently slow. The problem is not the speed of the scan but the time taken for reversal. High speed means that significant time and mechanical force are needed to achieve reversal. During reversal the beam is not being used; the technique is therefore inefficient at high scan speeds.

One particular problem to be addressed is the best way to implant large substrates. The implantation of flat computer and television screens is a particular requirement, but large area implantation is likely to be of general importance in the future. The presently available mechanical scanning techniques do not lend themselves to this requirement very well. It is an object of the present invention, at least in preferred embodiments, to provide a method of, and apparatus for, presenting a plurality of targets to an ion beam for ion implantation, particularly for use with large targets.

According to the present invention there is provided a method of presenting a plurality of targets to an ion beam comprising moving a plurality of targets back and forth in reciprocatory motion through an ion beam, reversing the direction of movement of the targets while outside the ion beam, and effecting at least part of such reversal of a target while another target or targets is or are passing through the beam.

In one simple form of the invention, the number of targets being reciprocated through the ion beam is two, and the sequence is such that the two targets follow each other through the ion beam in one direction, and then follow each other through the beam in the opposite direction, each target being reversed in direction while the other is passing through the beam.

A method of presenting two targets to an ion beam in accordance with the invention may comprise: moving a first target through an ion beam; moving a second target through the beam in the same direction as the first target; while the second target is passing through the ion beam, reversing the direction of movement of the first target; after the second target has moved through the ion beam, moving the first target through the ion beam in the opposite direction to the previous traversal by the second target; while the first target is passing through the beam, reversing the direction of movement of the second target; moving the second target through the beam in the same direction as the first target; while the second target is passing through the beam, reversing the direction of movement of the first target; after the second target has moved through the beam, moving the first target through the beam in the opposite direction to the last traversal by the second target; and while the first target is passing through the beam, reversing the direction of movement of the second target.

The invention also relates to the presentation of a number of targets greater than two. For example in some preferred forms the number of targets is an odd number greater than two and the sequence is such that succeeding targets always pass through the beam in opposite directions. For even numbers of targets, the targets follow each other through the beam in batches.

In one form, there may be provided in accordance with the invention a method of presenting to an ion beam a plurality of targets greater than two comprising: moving a first target through an ion beam; after the first target has passed through the beam, moving further targets through the beam; while the said further targets are passing through the beam, reversing the direction of movement of the first target; after the said further targets have passed through the beam, moving the first target back through the beam in the opposite direction to its first mentioned traversal; and repeating the sequence of the traversals of the said further targets.

Considering now generally preferred features of the invention, applicable to the presentation of two or more targets, it is preferred that each target is moved in a motion comprising a stage of movement at a substantially uniform speed in a first direction, a stage of deceleration to rest, a stage of acceleration in a second direction opposite to the first direction, a stage of movement at a substantially uniform speed in the said second direction, a stage of deceleration to rest, and a stage of acceleration in the said first direction up to the first said substantially uniform speed. Preferably the stages of uniform speed motion continue only long enough for the target to pass through the beam, and deceleration takes place substantially immediately the target leaves the beam. Similarly it is preferred that the acceleration stage brings the target up the the required speed just before the target moves into the ion implantation beam. Such an arrangement allows the maximum time for reversal of the target which is not in the beam. However in some arrangements the stage of uniform speed movement may extend beyond the time while the target is crossing the beam.

Where a target enters the ion beam in a direction of movement opposite to the immediately preceding traversal, it is preferred that one target passes into the beam substantially immediately after another leaves the beam. Where the target enters the ion beam in the same direction of movement to the immediately preceding traversal it is preferred that the targets follow each other immediately through the beam, and in such a case the beam can impinge on both targets at the same time. It is preferred that each target is always moving at a uniform speed when passing through the beam. Preferably the time taken for the reversals of direction of motion of a target is made substantially equal to half the duration of a whole period of repetition of the sequence of movement of the targets minus the time taken for a target to pass through the ion beam. Conveniently in each reversal of direction the speed of a target varies with time in accordance with a half cycle of a simple harmonic motion.

It will normally be arranged that the targets move through the ion beam in at least two planes spaced apart in the direction of the ion beam, preferably each target moving in a plane individual thereto and spaced from the plane of movement of each other target.

In order to produce a raster scan of the beam across the target, it will normally be arranged that there is produced a substantially continuous movement of the targets in a direction substantially at right angles to the traversals through the beam, at a speed substantially slower than the movement of the target through the ion beam. Alternatively the slow scan can be achieved by beam scanning.

It is to be appreciated that features which are set out hereinbefore or hereinafter with reference a method according to the invention, may also be provided in relation to an apparatus according to the invention, and vice versa.

In particular, there is provided in accordance with the invention apparatus for presenting a plurality of targets to an ion beam comprising a plurality of supports each for supporting a target, and drive means for moving the target supports back and forth in reciprocatory motion through an ion beam target region in a sequence of movements such that the target supports are reversed in direction of movement while outside the target region, and such that at least part of the reversal of a target support takes place while another support or supports is or are passing through the target region.

Conveniently the drive means for moving the target supports comprises a movement generator for producing a required sequence of motion, carrier means on which the target supports are mounted for carrying the target supports through a required sequence of movements, and coupling means linking the movement generator to the carrier means for driving the carrier means in response to the movement generator. For example the movement generator may comprise means for producing a movement consisting of a component of motion of a drive pin carried on a belt passing around a pair of parallel spaced apart pulleys, the component being the component of motion along a line joining the centres of the pulleys. The coupling means may comprise a rotary shaft driven in reciprocatory rotary motion corresponding to the linear component of motion of the drive pin. The carrier means may comprise a chassis driven in linear movement corresponding to the rotary movement of the coupling shaft, and carrying the said target support for movement through the ion beam. Conveniently, the carrier means is housed in an evacuated enclosure and is linked to the movement generator outside the evacuated enclosure by the rotary coupling shaft which passes through a vacuum seal. Also, conveniently, the required slow scan of the targets may be provided by sliding movement of the said rotary shaft through the seal, to allow movement of the entire carrier means, chassis, and target supports, in a direction perpendicular to the main scanning motion. This latter step of producing the slow scan is one of many techniques which are available.

In accordance with a particularly preferred feature, the apparatus may include counterbalance means for providing a counterbalance load driven by the drive means, the counterbalance means being arranged to produce a varying load on the drive means which is an inversion of the load produced by the target supports.

Conveniently there is also provided further drive means for producing a substantially continuous movement of the target supports in a direction substantially at right angles to the traversals through the beam, to produce a raster scan of the beam across the targets on the target supports in operation.

Embodiments of the invention will now be described by way of example with reference to the accompanying drawings in which

FIG. 5b shows a diagrammatic side view taken in the direction V in FIG. 5a; and

FIG. 7 is a diagrammatic representation of a compensating device for applying a counterbalance load to a motor driving the drive mechanism shown in FIG. 2a.

Figure 1:
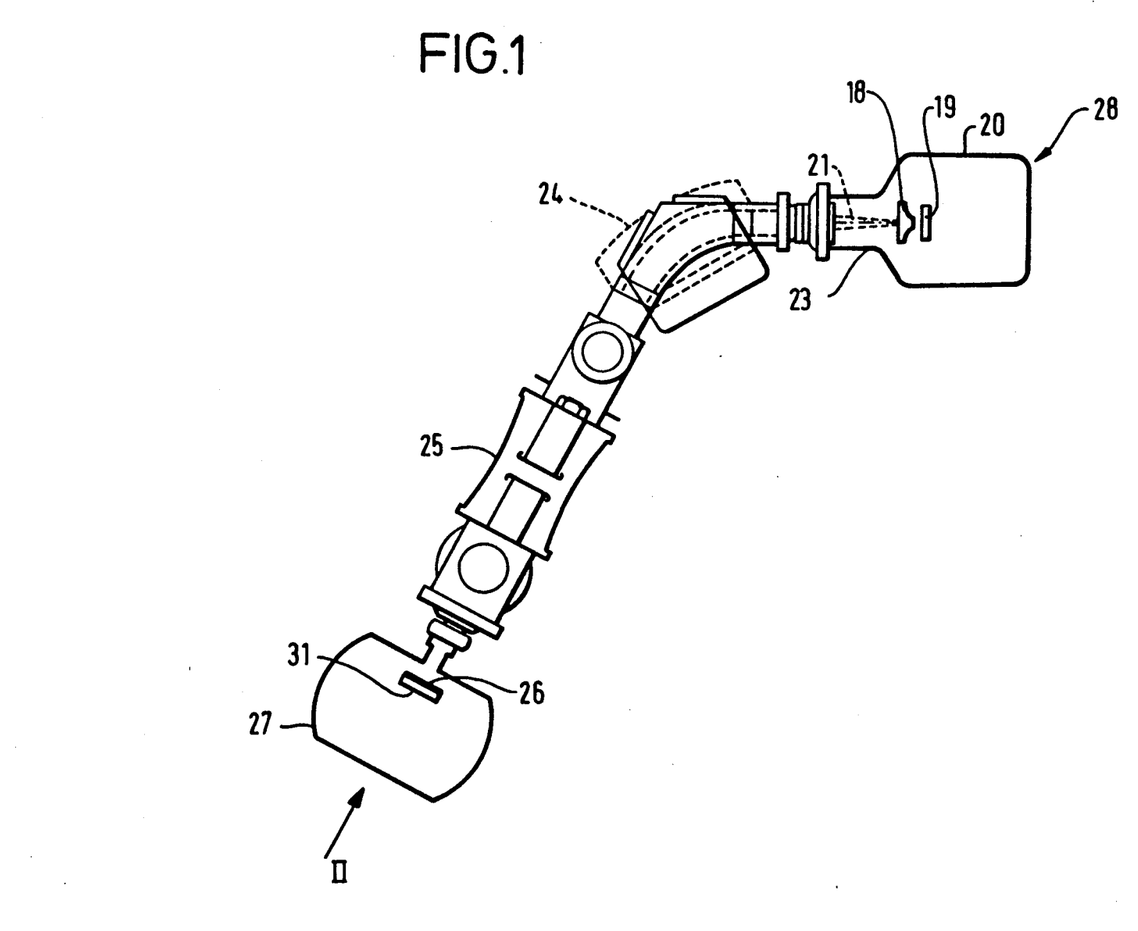
FIG. 1 is a diagrammatic plan view of ion implantation apparatus which may embody the present invention.

Referring to FIG. 1, an ion implantation apparatus comprises an ion source 28 aligned with an extraction electrode 18 within a vacuum chamber 20. A beam of ions 21 for implantation emerges through a side port 23 along an outlet path leading to an analysing magnet 24 for selection of the required ion species for implantation. The ion beam leaving the analysing magnet 24 passes through various acceleration stages indicated generally at 25 and impinges on a target element 26 such as a semi-conductor wafer, within a target chamber 27. With the exception of the components within the vacuum chamber 20, the other components shown in FIG. 1 are known, and are described in more detail in, for example, the aforementioned U.S. Pat. No. 4,578,589.

Figures 2A, 2B:
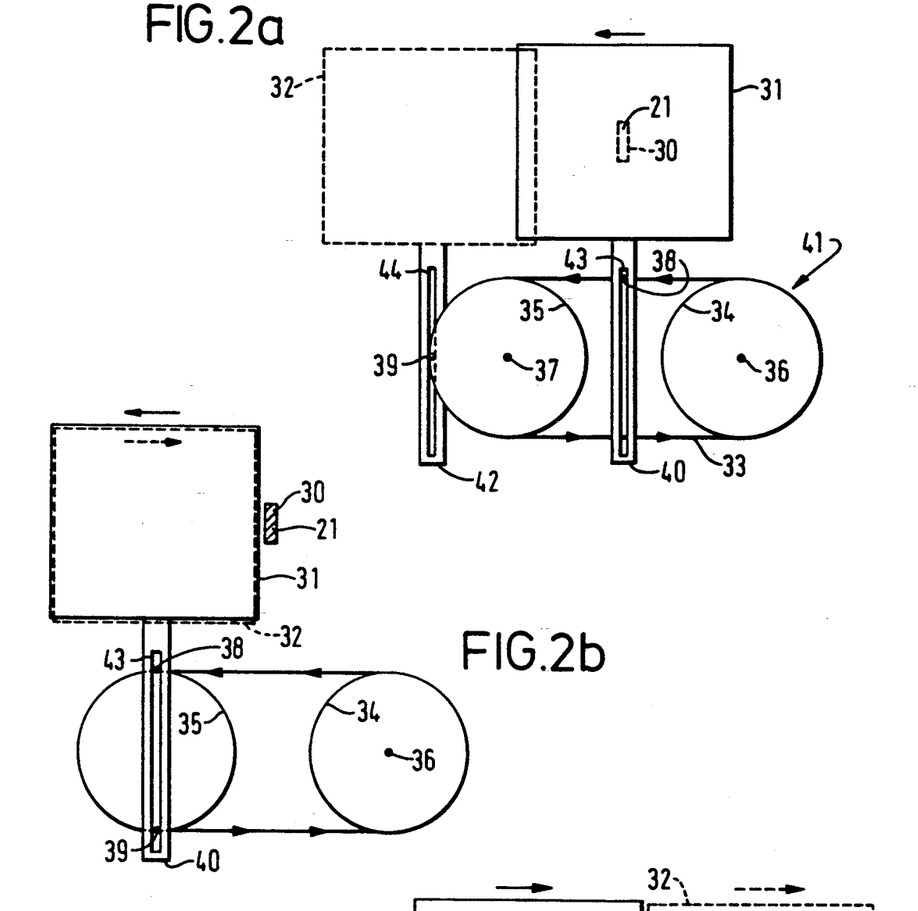
FIG. 2a shows a diagrammatic end view, along the arrow II in FIG. 1, and shows diagrammatically apparatus embodying the invention for presenting two targets to an ion beam.
FIGS. 2b and 2c show the same diagrammatic view as FIG. 2a, but at later stages of a sequence of movements.
Figure 2C:
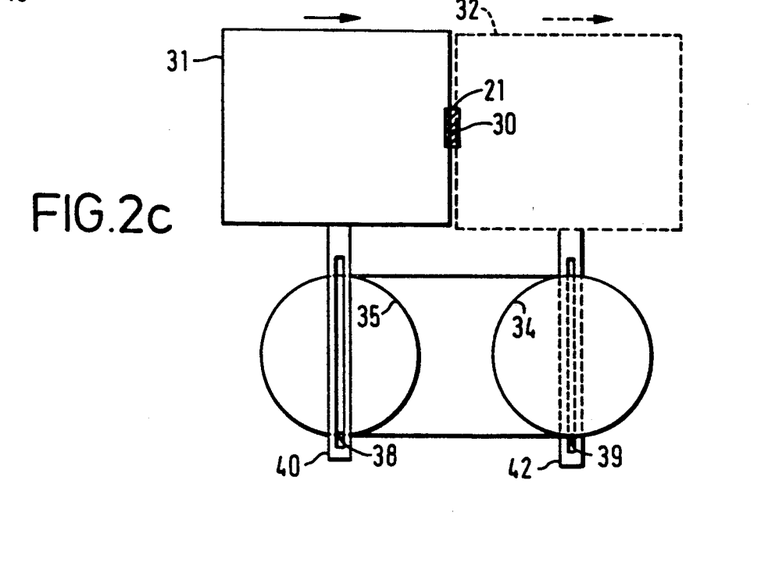
Figure 3A:
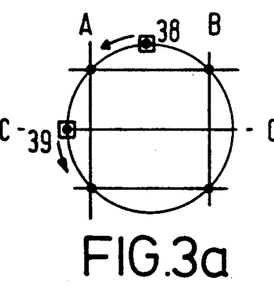
FIGS. 3a, 3b and 3c show three phase diagrams illustrating the movement of the targets in FIGS. 2a, 2b and 2c respectively.
Figure 3B:
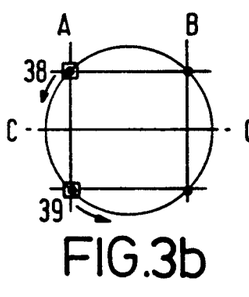
Figure 3C:
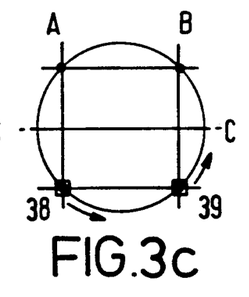

FIGS. 2a, 2b and 2c show diagrammatically apparatus for presenting to an ion beam two targets for ion implantation in the targets. The target region, at which the ion beam impinges on the targets is indicated at 30, and two supports for targets are indicated at 31 and 32. The view in FIG. 2a is taken in the direction of the arrow II in FIG. 1, looking towards the ion beam 21. In FIG. 2a the target itself is not shown, being on the far side of the target support 31. In FIG. 2a the target support 32 lies behind the target support 31, from the direction of viewing of FIG. 2a, that is to say the target support 32 is closer to the source of the ion beam 21. The target supports 31 and 32 are mounted in tracks (not shown) for movement parallel to each other in planes spaced apart from each other in the direction of the ion beam 21.

Below the target supports 31 and 32 is positioned a drive mechanism 41, referred to as a race track driver, comprising a drive belt 33 passing around two spaced apart pulleys 34 and 35 driven for rotation about axes 36 and 37 extending perpendicular to the plane of the target supports 31 and 32. The belt 33 carries a drive pin 38 projecting away from the ion beam, that is to say outwardly from the face of FIG. 2a, and a second drive pin 39 projecting in the opposite direction towards the ion beam 21. The target support 31 has a drive arm 40 projecting downwardly towards the drive mechanism 41, and passing on the remote side of the drive mechanism 41 relative to the ion beam 21. The target support 32 has a similar arm 42 which passes on the other side of the drive mechanism 41, i.e. closer to the ion beam 21. The arms 40 and 42 have elongate slots 43 and 44 respectively, which engage with the drive pins 38 and 39, respectively.

In operation, the drive mechanism 41 is rotated so that the pin 38 moves to the left in FIG. 2a and the pin 39 moves around the pulley 35 in an anti-clockwise direction. The effect of the rotation of the pulleys 34 and 35 is the following sequence of movements. Starting from the position of FIG. 2a, the target support 31 moves to the left in FIG. 2 at a constant velocity until the pin 38 reaches the pulley 35. During this time, the pin 39 accelerates the target support 32, in a movement to the right in FIG. 2a until the pin 39 reaches the lower edge of the pulley 35, bringing the target supports 31 and 32 to the positions shown in FIG. 2b. Next the pin 39 moves the target support 32 to the right in FIG. 2 at a constant velocity, until the pin 39 reaches the periphery of the pulley 34, i.e. the position shown in FIG. 2c. During this time, the pin 38 first decelerates the target support 31 to a position of rest, when the pin 38 reaches the left most periphery of the pulley 35 in FIG. 2b, and then accelerates the target support 31 until the pin 38 reaches the lowermost periphery of the pulley 35, i.e. the position shown in FIG. 2c. The sequence continues in the same manner, until the pins 38 and 39 return to the positions shown in FIG. 2a. The relative phases of the drive pins 38 and 39 are shown in the phase diagrams 3a, 3b and 3c which correspond to the positions of the target supports 31 and 32, shown in FIG. 2a, 2b and 2c respectively.

It is to be appreciated that in a practical embodiment, it will normally be necessary to provide two drive mechanism 41, driven by a common electric motor, with the pins 38 and 39 mounted on the two separate drive mechanisms. The arms 40 and 42 in FIG. 2 are shown driven by pins from a single belt 33, for the purpose of easy explanation of the concept of the drive sequence.

Also it is to be appreciated that FIG. 2c is a diagrammatic representation. In a practical embodiment it is important to arrange that the distance between the centres of the pulleys 34 and 35 is greater than the distance between the two pins 38 and 39 while travelling along the straight of the race track, by a dimension determined by the beam size, for example by the width of the beam plus an additional safety margin, to ensure that during reversal each target leaves the beam completely before the next enters.

The effect of the movements described is that the target supports 31 and 32, carrying targets 26, move back and forth across the ion beam 21 so that the targets are scanned by the ion beam for ion implantation. At the same time the entire assembly of target supports 31 and 32, and drive mechanism 41, is moved in a slow scan in the direction indicated by the arrow X in FIG. 2, so as to produce a raster scan of the ion target region 30 across each of the targets on the target supports 31 and 32.

The advantage of the arrangement shown is that one target is reversing while the other is being implanted. Fast scanning is possible because there is plenty of time for reversal. In the case of the two target system in FIGS. 2a to 2c, the reversal time is approximately equal to the scan time.

The arrangement can be considered as two mechanical scans of the target region, which are 90° out of of phase. The race track driver 41 of FIG. 2 imparts to the target supports two linear movements and two simple harmonic motion reversals per cycle. The linear movement is given by the component, along the line joining the centres of the two pulleys 34 and 35, of the motion of the drive pin travelling around the race track at a constant speed.

Figure 4:
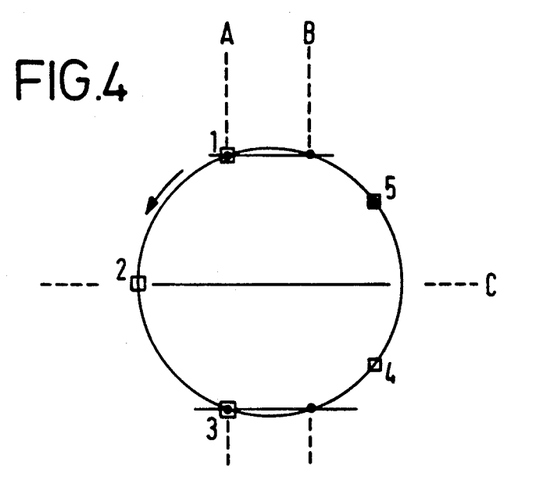
FIG. 4 shows a phase diagram indicating a sequence of movements in apparatus embodying the invention for presenting five targets to an ion beam.

The system described so far is a two target system. In practice any number of targets can be used. The larger the number of targets, the longer is the period available for reversal, and therefore the faster the system can be driven. Also the heat load can be better spread over a larger number of targets. It has been found that for systems using more than two targets, an odd number of targets give best results. FIG. 4 shows, by way of example, a phase diagram for the movement of a five target system. Such an arrangement has advantage since five plates give a well balanced system from the mechanical vibration point of view. In FIG. 4, (and also 3a, 3b and 3c), the region of the phase diagram between the dotted lines A and B represents the stage of the sequence at which the targets are moving at a constant velocity through the target region. The regions to the left of line A and to the right of line B, represent the stages of the sequence at which the targets are being accelerated and decelerated. The points on the phase diagram at which the circle cuts the line C represent stages of the sequence at which the targets are stationary.

Considering the five targets 1 to 5 represented in the phase diagram of FIG. 4, the positions shown are as follows. Target 1 is finishing a linear scan throught the target region at uniform speed. Target 3 is starting a linear scan through the target region at uniform speed. Target 2 is stationary at the mid point of reversal. Target 5 is accelerating and target 4 is decelerating.

The two target system which has been described with reference to FIGS. 2a to 2c, has been shown, for simplicity, as consisting of four equal stages of the sequence of motion. In a practical embodiment, the reversal stages will normally occupy less than half the cycle, and the distance between the drive pins on the race track driver will be made equal to the part of the cycle reserved for reversal, that is to say the part which is less than half the cycle. This enables beam clearance to be achieved at the moment when one target is starting reversal an the other is completing reversal, while allowing a near zero gap between the targets as they traverse through the target region following each other in the same direction. During reversals, one target must clear the beam before the other target can enter the beam to start its linear scan. For this reason, the stages of the sequence allocated to reversal should be slightly less than half the total period of the cycle, to allow for complete clearance from the beam by one target before the other target enters. The ability to pass the two targets through the beam in the same direction at two stages of the cycle, arises with the two target system, but will not normally arise where more than two targets are provided. Odd number target systems normally require that consecutive targets being scanned must pass through the beam in opposite directions, and in such a case one target must clear the beam before the other can start to be scanned.

Figure 5A:
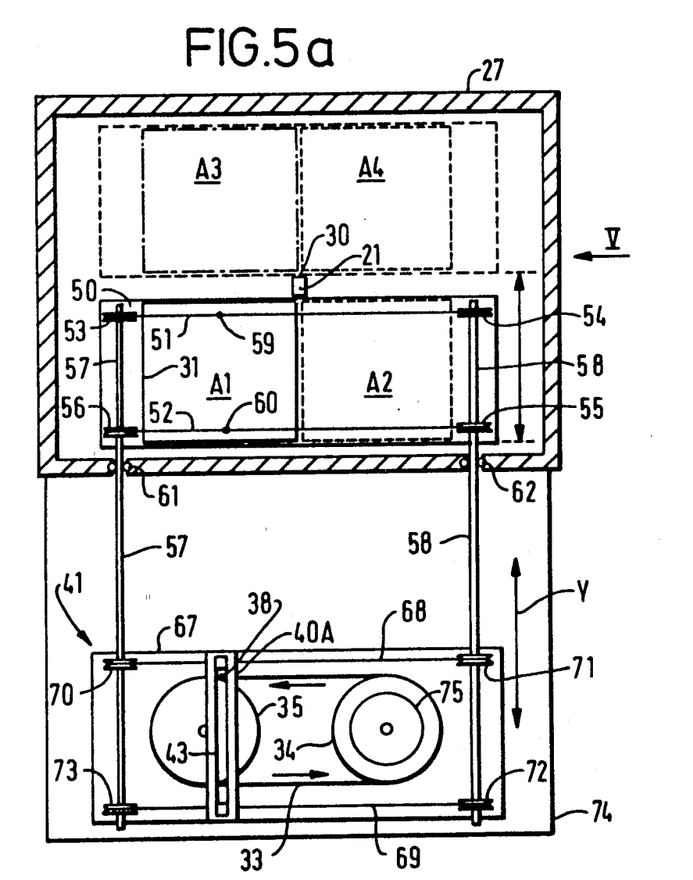
FIG. 5a shows in more detail an example of a mechanism for producing the movements illustrated in FIG. 2a, 2b and 2c, and illustrates an apparatus embodying the invention.
Figure 5B:
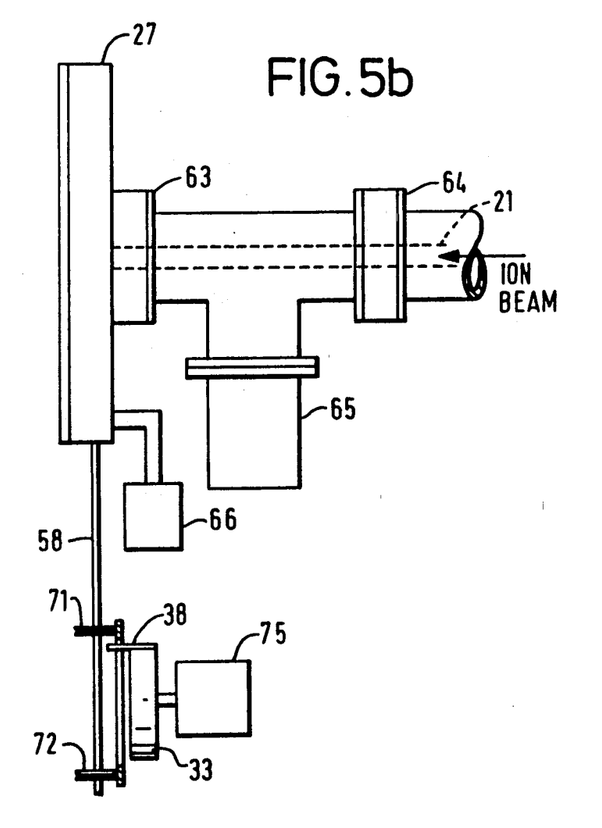

Reference will now be made to FIGS. 5a and 5b which show, in end view and side view respectively, a diagrammatic layout of a two target system embodying the invention. In general, components which have already been identified in previous figures are indicated by like reference numerals in FIGS. 5a and 5b. In FIGS. 5a and 5b, only a single target, correspond to the target 31 in FIGS. 2a to 2c, is shown, and only one drive mechanism 41 for that target is shown. In practice, the second target 32 and its drive system merely duplicate the target 31 and its drive system, although being driven by the same electric motor, approximately 90° out of phase with the first target.

The target 31 is mounted on tracks represented diagrammatically at 50, for reciprocatory linear motion through positions indicated as A1 and A2 in FIG. 5a, and to extreme positions beyond A1 and A2 at either side.

The drive for this motion is provided by wires 51 and 52 trained about pulleys 53 to 56 driven by shafts 57 and 58. The wires 51 and 52 are secured to the target 31 by fasteners 59 and 60. The target 31 and associated drive elements, are housed within a vacuum chamber 27, the shafts 57 and 58 passing out of the chamber 27 through seals 61 and 62. The ion beam 21 enters the vacuum chamber 27 through gate values 63 and 64, impinging at a target region 30. The vacuum chamber is evacuated by a cryopump 65 and rotary pump 66.

Outside the vacuum chamber 27, the shafts 57 and 58 pass to a drive mechanism indicated generally at 41, and comprising a race track driver having the components already described in FIG. 2a. The motion of the drive pin 38 is transferred to a transverse bar 40A which moves in tracks on a base 67, in a reciprocatory linear motion. The bar 40A is secured at each end to two wires 68 and 69 which are trained about pulleys 70 to 73, mounted in pairs 70 and 73, and 71 and 72, on the shafts 57 and 58 respectively. (It is to be appreciated that, in all instances the wires and belts which have been referred to, may be replaced by belts, wires or chains, as appropriate.) In addition to the motions provided by the race track driver 41, the entire base 67 is mounted on tracks (not shown) on a main frame 74, for driven movement in the direction of the arrow Y, to effect a slow scan of the targets relative to the target region 30.

In operation, rotation of the pulleys of the race track driver 41 produces in the bar 40A the required linear movement, comprising stages of uniform speed, and stages of simple harmonic motion acceleration and deceleration, as has been described with reference to FIGS. 2a to 2c. This motion is transferred by the wires 68 to a rotary motion of the shafts 57 and 58. This rotary motion is then transferred back to a linear motion by the effect of the wires 51 and 52 which are fastened at 59 and 60 to the target support 31. Thus the target support 31 is moved in the same manner as the target support 31 in FIGS. 2a to 2c, but through the intermediate coupling means provided by shafts 57 and 58. The purpose of this is to allow the slow speed scan along the arrow Y which produces a corresponding movement of the base 50 inside the vacuum chamber 27 from the target positions A1 and A2, to target positions A3 and A4, indicated in dotted lines. Thus the combined effect of the movements is that the target 31 is scanned back and forth through the target region 30 by the race track driver 41, and is also slowly scanned through the target region 31 at right angles to the main reciprocatory motion. As has been mentioned, a corresponding system is provided for the second target support 32 (not shown in FIGS. 5a and 5b) driven by the same electric motor 75, but approximately 90° out of phase to the first target support 31.

By way of example of dimensions which may be used, the target 26 mounted on the target support 31 may be a silicon on quartz substrate of 34 cm × 32 cm which is implanted with baron and phosphorus ions. The fast scan may be in the range 1–5 Hz. The slow scan may be of the order of 0.01–0.1 Hz. Care must be taken to minimise the weight of the substrate holders in order to facilitate high speed scans of the order of 5 Hz. The vacuum chamber has a very small pumped volume so that rapid roughing pumpdown can be achieved, and a large cryopump be provided for rapid attainment of high vacuum (1E-5 to 1E-6 torr range).

Techniques which may be used for the slow scan of the targets include (i) moving the vacuum chamber on a sliding vacuum seal (the drive mechanism then moving with the chamber); (ii) moving the target and its immediate drive mechanisms in the vacuum chamber while the primary drive mechanisms move in air (the arrangement shown in FIGS. 5a and 5b); or (iii) an arrangement as in (ii) but with the primary drive mechanism outside the vacuum chamber being stationery, there then being provided a separate drive into the vacuum chamber for effecting slow scan movement of the target supports and their immediate associated drive elements.

There will now be described with reference to FIGS. 6a and b and FIG. 7, means for providing a variable counterbalance load to be driven in conjunction with the drive mechanism 41 described with reference to the previous figures, for the purpose of compensating for the varying load on the motor during acceleration and deceleration of the target supports. The counterbalance device will be described for use with the apparatus of FIGS. 2a to 3c, and FIGS. 5a and 5b, which show the simplest version of the apparatus which has only two targets being scanned. However it will be appreciated that the principles of the compensating arrangement may also be applied where more than two target supports are used.

As it is preferable that the system should be driven by a single drive motor (so that the phase relationship between the two target scan motions can easily be maintained), the problem of maintaining a constant drive motor speed is not trival. The target being reversed has to be decelerated to rest and then accelerated to full speed in the opposite direction while the other target is driven at a constant speed. The inertia of the decelerating target will tend to increase the motor speed. The motor has to resist a tendancy to increase in speed during deceleration of a target. Similarly the motor must resist deceleration during acceleration of the target.

Where a servo motor is used, this will attempt to turn at a constant speed, but there is a limit to the precision with which this can be done. The use of a large flywheel is another approach, but inconveniently large inertias will be required if very good uniformity is to be achieved.

It is therefore a preferred feature of the invention that a load compensation technique can be used. FIG. 6a shows the changing torque experienced by the motor during the reversal of one of the targets. The maximum deceleration requirement for the motor to cope with occurs one quarter of the way through the reversal period TR. At the half way stage, the target acceleration is at a maximum but the motor is not required to contribute to this as the acceleration direction is along the radius of the race track, so that no component of acceleration in the direction of movement of the drive pin on the race track is required. The maximum acceleration requirement from the motor is at the three quarter way stage. At the end of the reversal, and during the constant speed, straight section of the race track, no acceleration or deceleration forces are present, and the motor merely has to overcome frictional resistance to motion. It is extremely important that a constant speed of rotation of the motor should be maintained, and the surest way to achieve this is to arrange that the motor does not see a varying load. Therefore an additional load pattern such as shown in FIG. 6b needs to be superimposed on the load pattern in FIG. 6a. The load pattern in FIG. 6b is the inverse of the load pattern imposed on the motor by driving the target, as shown in FIG. 6a.

Figure 6A:
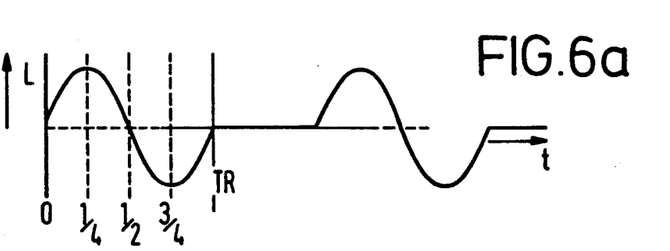
FIG. 6a is a graph showing a variation of load produced by the movements of a target support shown in FIG. 2a, with time.
Figure 6B:
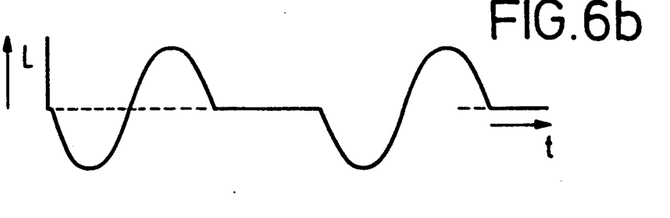
FIG. 6b is a graph of a corresponding compensating load produced by a load compensating device provided in accordance with a preferred embodiment of the invention.

If the load pattern of FIG. 6a were a simple sinusoidal variation, then compensation could be achieved by a phase shift. However the load pattern of FIG. 6a is not a simple sinusoidal shape, so that only an accurate inversion of the load pattern of FIG. 6a can give the required result. Such an inversion is shown in FIG. 6b.

Figure 7:
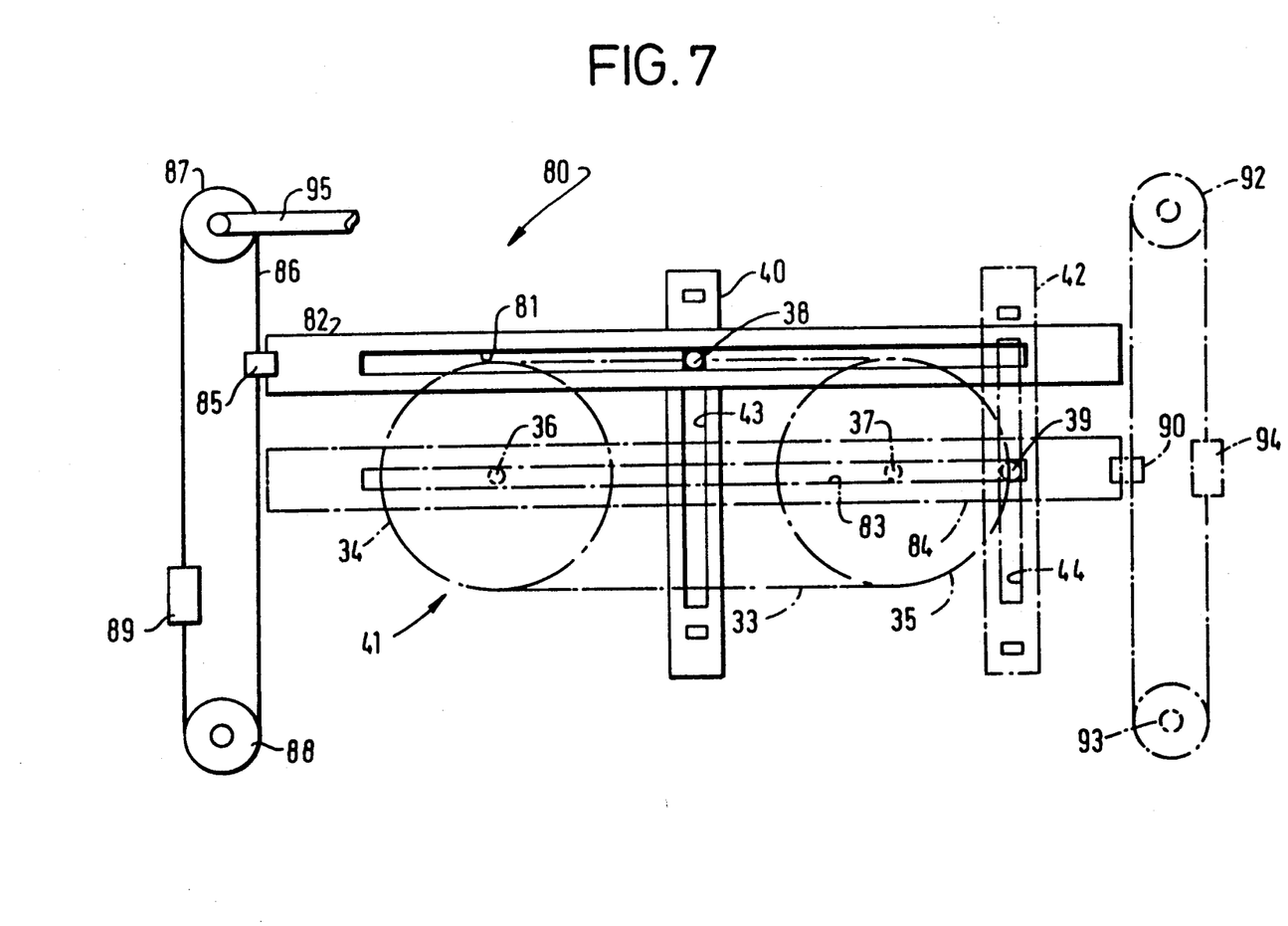

Such an inversion can be achieved by the compensation mechanism 80 shown in FIG. 7. A number of components shown are common to FIG. 7 and, for example, FIGS. 2a and 2b, and like references are used to indicate such items. The drive pin 38 drives the drive arm 40 which effects movement of the target support 31, as in FIG. 2a. The same drive pin 38 is engaged in a slot 81 in a compensation beam 82. Similarly the drive pin 39 which drives the drive arm 42 in motion, as has been described with reference to FIG. 2a, is engaged in a slot 83 in a compensation beam 84. The beams 82 and 84 are mounted on guides (not shown) to allow movement perpendicular to their length, in the same way that the drive arms 40 and 42 are mounted to allow movement perpendicular to their length. The arm 82 is connected by a coupling 85 to a drive belt 86 entrained about pullies 87 and 88. A counterbalance weight 89 is carried on the belt 86. A similar arrangement is provided for the compensation beam 84, provided by corresponding components 90 to 94. The mass of each compensation beam (82 or 84) together with its counterbalance weight (89 or 94) is adjusted to match the inertia of the main scanning system for the target support 31 and 32. The counterbalance weights 89 and 94 are provided to avoid a gravity contribution to the load pattern, when used in the vertical plane.

It will be seen from FIG. 7 that in operation the compensation beams 82 and 84, with their counterbalance weights 89 and 94, follow a pattern of acceleration which is an inversion of the acceleration pattern of the target supports 31 and 32 in FIG. 2a. When a target support is accelerating, the associated compensating beam is accelerating in the opposite sense, so far as its effect on the drive motor is concerned. When a target support is moving at constant velocity, the associated compensating beam is stationary. During this stage neither the target support nor its compensating beam are accelerating.

Although, for simplicity, the compensation beams 82 and 84 are shown diagrammatically in FIG. 7 with a single counterbalance weight for each beam, in a practical embodiment both ends of each beam are supported by a connecting link 85 or 90, to an appropriate belt and pulley arrangement. As indicated at 95, an axial link is then provided parallel the length of the beams 82 and 84, to ensure correct orientation of the compensating beams. The link 95 (leading from the pulley 87 to a corresponding pulley not shown) constrains the beam 82 to an orientation with its axis, at the other end of the beam 82 parallel to the line joining the centres of the two pulley wheels of the main race track mechanical drive means 41.

I claim:

1. A method of presenting a plurality of targets to an ion beam comprising moving a plurality of targets back and forth in reciprocatory motion through an ion beam, reversing the direction of movement of the targets while outside the ion beam, and effecting at least part of such reversal of a target while another target or targets is or are passing through the beam.

2. A method according to claim 1 in which the number of targets being reciprocated through the ion beam is greater than two, comprising:

moving a first target through an ion beam;

after the first target has passed through the beam, moving further targets through the beam;

while the said further targets are passing through the beam, reversing the direction of movement of the first target;

after the said further targets have passed through the beam, moving the first target back through the beam in the opposite direction to its first mentioned traversal; and repeating the sequence of the traversals of the said further targets.

3. A method according to claim 2 in which the targets move through the ion beam in planes spaced apart in the direction of the ion beam, each target moving in a plane individual thereto and spaced from the plane of movement of each other target.

4. A method according to claim 1 in which the time taken for the reversals of direction of motion of a target is made substantially equal to half the duration of a whole period of repetition of the sequence of movement of the targets minus the time taken for a target to pass through the ion beam.

5. Apparatus for presenting a plurality of targets to an ion beam comprising a plurality of supports each for supporting a target, and drive means for moving the target supports back and forth in reciprocatory motion through an ion beam target region in a sequence of movements such that the target supports are reversed in direction of movement while outside the target region, and such that at least part of the reversal of a target support takes place while another support or supports is or are passing through the target region.

6. Apparatus according to claim 5 including counterbalance means for providing a counterbalance load driven by the drive means, the counterbalance means being arranged to produce a varying load on the drive means which is an inversion of the load produced by the target supports.

7. Apparatus according to claim 5 in which the drive means comprises a movement generator for producing a required sequence of motion, carrier means on which the supports are mounted for carrying the supports through a required sequence of movements, and coupling means linking the movement generator to the carrier means for driving the carrier means in response to the movement generator.

8. Apparatus according to claim 5 in which the number of target supports is greater than two, and the drive means is arranged to move the target supports in a sequence comprising: moving a first target through an ion beam; after the first target has passed through the beam, moving further targets through the beam; while the said further targets are passing through the beam, reversing the direction of movement of the first target; after the said further targets have passed through the beam, moving the first target back through the beam in the opposite direction to its first mentioned traversal; and repeating the sequence of the traversals of the said further targets.

9. Apparatus according to claim 8 in which the target supports are movable through the ion beam in planes spaced apart in the direction of the ion beam, each support target being movable in a plane individual thereto and spaced from the plane of movement of each other target.

10. Apparatus according to claim 5 including a further drive means for producing a substantially continuous movement of the target supports in a direction substantially at right angles to the traversals through the beam, to produce a raster scan of the beam across the target supports.

11. A method of presenting a plurality of targets to an ion beam comprising;

moving a plurality of targets back and forth in reciprocatory motion through an ion beam in planes spaced apart in the direction of the ion beam, each target moving in a plane individual thereto and spaced from the plane of movement of each other target, reversing a direction of movement of the targets while outside the ion beam, and effecting at least part of such reversal of a target while another at least one target is or are passing through the beam.

12. A method of presenting a plurality of targets to an ion beam comprising:

moving a plurality of targets back and forth in reciprocatory motion through an ion beam in at least two planes spaced apart in the direction of the ion beam:

reversing the direction of movement of the targets while outside the ion beam and effecting at least part of such reversal of a target while another target or targets is or are passing through the beam.

13. A method according to claim 12 in which the number of targets being reciprocated through the ion beam is two, comprising:

moving a first target through an ion beam;

moving a second target through the beam in the same direction as the first target;

while the second target is passing through the ion beam, reversing the direction of movement of the first target;

after the second target has moved through the ion beam, moving the first target through the ion beam in the opposite direction to the previous traversal by the second target;

while the first target is passing through the beam, reversing the direction of movement of the second target;

moving the second target through the beam in the same direction as the first target;

while the second target is passing through the beam, reversing the direction of movement of the first target;

after the second target has moved through the beam, moving the first target through the beam in the opposite direction to the last traversal by the second target; and while the first target is passing through the beam, reversing the direction of movement of the second target.

14. A method of presenting two targets to an ion beam by moving the targets back and forth in reciprocatory motion through the ion beam, comprising:

moving a first target through an ion beam;

moving a second target through the beam in the same direction as the first target;

while the second target is passing through the ion beam, reversing the direction of movement of the first target while outside the ion beam;

after the second target has moved through the ion beam, moving the first target through the ion beam in the opposite direction to the previous traversal by the second target;

while the first target is passing through the beam, reversing the direction of movement of the second target while outside the ion beam;

moving the second target through the beam in the same direction as the first target;

while the second target is passing through the beam, reversing the direction of movement of the first target while outside the ion beam;

after the second target has moved through the beam, moving the first target through the beam in the opposite direction to the last traversal by the second target; and while the first target is passing through the beam, reversing the direction of movement of the second target while outside the ion beam.

15. Apparatus for presenting a plurality of targets to an ion beam comprising a plurality of supports each for supporting a target, and drive means for moving the target supports back and forth in reciprocatory motion through an ion beam target region in a sequence of movements such that the target supports are reversed in direction of movement while outside the target region, and such that at least part of the reversal of a target support takes place while another support or supports is or are passing through the target region, the target supports being movable through the ion beam in planes spaced apart in the direction of the ion beam, each support target being movable in a plane individual thereto and spaced from the plane of movement of each other target.

16. Apparatus for presenting a plurality of targets to an ion beam comprising a plurality of supports each for supporting a target, and drive means for moving the target supports back and forth in reciprocatory motion through an ion beam target region in a sequence of movements such that the target supports are reversed in direction of movement while outside the target region, and such that at least part of the reversal of a target support takes place while another support or supports is or are passing through the target region, the target supports being movable through the ion beam in at least two planes spaced apart in the direction of the ion beam.

17. Apparatus according to claim 16 in which the number of target supports is two, and the drive means is arranged to move the target supports in a sequence comprising: moving a first target through an ion beam; moving a second target through the beam in the same direction as the first target; while the second target is passing through the ion beam, reversing the direction of movement of the first target; after the second target has moved through the ion beam, moving the first target through the ion beam in the opposite direction to the previous traversal by the second target; while the first target is passing through the beam, reversing the direction of movement of the second target; moving the second target through the beam in the same direction as the first target; while the second target is passing through the beam, reversing the direction of movement of the first target; after the second target has moved through the beam, moving the first target through the beam in the opposite direction to the last traversal by the second target; and while the first target is passing through the beam, reversing the direction of movement of the second target.

18. Apparatus for presenting two targets to an ion beam comprising two supports each for supporting a target, and drive means for moving the target supports back and forth in reciprocatory motion through an ion beam target region in a sequence of movements such that the target supports are reversed in direction of movement while outside the target region, and such that at least part of the reversal of a target support takes place while another support or supports is or are passing through the target region, the drive means being arranged to move the target supports in a sequence comprising: moving a first target through an ion beam; moving a second target through the beam in the same direction as the first target; while the second target is passing through the ion beam, reversing the direction of movement of the first target; after the second target has moved through the ion beam, moving the first target through the ion beam in the opposite direction to the previous traversal by the second target; while the first target is passing through the beam, reversing the direction of movement of the second target; moving the second target through the beam in the same direction as the first target; while the second target is passing through the beam, reversing the direction of movement of the first target; after the second target has moved through the beam, moving the first target through the beam in the opposite direction to the last traversal by the second target; and while the first target is passing through the beam, reversing the direction of movement of the second target.

* * * * *